United States Patent
Maeda (10) Patent No.: US 10,580,670 B2
(45) Date of Patent: Mar. 3, 2020

(54) LASER PROCESSING APPARATUS

(71) Applicant: DISCO CORPORATION, Tokyo (JP)

(72) Inventor: Tsutomu Maeda, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 146 days.

(21) Appl. No.: 15/453,450

(22) Filed: Mar. 8, 2017

(65) Prior Publication Data

US 2017/0263473 A1 Sep. 14, 2017

(30) Foreign Application Priority Data

Mar. 9, 2016 (JP) .................................. 2016-045852

(51) Int. Cl.
| | |
|---|---|
| *H01L 21/67* | (2006.01) |
| *B23K 26/00* | (2014.01) |
| *H01L 21/687* | (2006.01) |
| *B23K 26/53* | (2014.01) |
| *B23K 26/03* | (2006.01) |
| *B23K 101/40* | (2006.01) |
| *B23K 103/00* | (2006.01) |

(52) U.S. Cl.
CPC ...... *H01L 21/67092* (2013.01); *B23K 26/032* (2013.01); *B23K 26/53* (2015.10); *B23K 2101/40* (2018.08); *B23K 2103/56* (2018.08)

(58) Field of Classification Search
CPC . H01L 21/67092; B23K 26/032; B23K 26/53; B23K 2103/56; B23K 2101/40
USPC .................................................... 219/121.68
See application file for complete search history.

(56) References Cited

U.S. PATENT DOCUMENTS

| | | | | |
|---|---|---|---|---|
| 6,159,825 A | * | 12/2000 | Henley | ................. B81C 1/0038 438/460 |
| 6,562,698 B2 | * | 5/2003 | Manor | ............... B23K 26/0604 438/460 |
| 6,591,154 B2 | * | 7/2003 | Haight | .............. H01L 21/67288 438/12 |
| 7,169,687 B2 | * | 1/2007 | Li | ...................... B23K 26/0622 438/463 |
| 7,305,754 B2 | * | 12/2007 | Sekiya | ................. H01C 17/006 29/610.1 |
| 7,380,322 B2 | * | 6/2008 | von Detten | ............ H01R 43/28 29/33 M |

(Continued)

FOREIGN PATENT DOCUMENTS

| | | |
|---|---|---|
| JP | 2010-123723 | 6/2010 |
| JP | 2015-020177 | 2/2015 |

*Primary Examiner* — Eric S Stapleton
(74) *Attorney, Agent, or Firm* — Greer Burns & Crain Ltd.

(57) ABSTRACT

A controller of a laser processing apparatus includes: a storage section that stores processing conditions for forming modified layers along division lines of a wafer; and a processing line calculation section that displays a position at which the modified layer is planned to be formed and which is stored as the processing condition, on a display panel as a processing line. The processing line calculation section displays the processing line on the display panel superimposed on a first division line, in a region in which a start point or end point of the first division line is connected to a second division line. A start point or end point of a first modified layer formed along the first division line is permitted to be re-set on the display panel so as not to interfere with a second modified layer formed along the second division line.

4 Claims, 6 Drawing Sheets

(56) References Cited

U.S. PATENT DOCUMENTS

| | | | | |
|---|---|---|---|---|
| 7,459,401 B2 * | 12/2008 | Ono | ................ | H01L 21/78 257/E21.599 |
| 7,582,848 B2 * | 9/2009 | Smart | ................ | B23K 26/0736 219/121.69 |
| 7,710,582 B2 * | 5/2010 | Koga | ................ | B23K 26/04 356/600 |
| 7,715,025 B2 * | 5/2010 | Iwamoto | ................ | G01D 5/30 356/614 |
| 7,776,720 B2 * | 8/2010 | Boyle | ................ | B23K 26/0648 438/463 |
| 8,252,667 B2 * | 8/2012 | Morikazu | ................ | B23K 26/0626 438/463 |
| 8,258,045 B2 * | 9/2012 | Morikazu | ................ | B23K 26/032 438/463 |
| 8,314,014 B2 * | 11/2012 | Morikazu | ................ | B23K 26/0608 438/463 |
| 8,431,861 B2 * | 4/2013 | Sawabe | ................ | B23K 26/03 219/121.83 |
| 8,518,803 B2 * | 8/2013 | Morikazu | ................ | H01L 21/67132 438/463 |
| 8,766,137 B2 * | 7/2014 | Nomaru | ................ | B23K 26/0853 219/121.68 |
| 9,423,248 B2 * | 8/2016 | Lu | ................ | G01B 11/272 |
| 9,530,695 B2 * | 12/2016 | Maeda | ................ | H01L 21/67092 |
| 9,925,618 B2 * | 3/2018 | Maeda | ................ | H01L 21/681 |
| 2003/0109141 A1 * | 6/2003 | Peiter | ................ | H01L 21/3043 438/707 |
| 2003/0128802 A1 * | 7/2003 | Matsuzawa | ................ | G03F 7/0382 378/34 |
| 2003/0190770 A1 * | 10/2003 | Yeom | ................ | C30B 29/20 438/113 |
| 2005/0118774 A1 * | 6/2005 | Sekiya | ................ | H01C 17/006 438/382 |
| 2005/0205778 A1 * | 9/2005 | Kitai | ................ | B23K 26/032 250/309 |
| 2005/0236378 A1 * | 10/2005 | Boyle | ................ | B23K 26/0648 219/121.67 |
| 2006/0000812 A1 * | 1/2006 | Weber | ................ | B23K 26/03 219/121.61 |
| 2006/0003551 A1 * | 1/2006 | Mancini | ................ | H01L 21/3065 438/462 |
| 2006/0121697 A1 * | 6/2006 | Fujii | ................ | B28D 5/00 438/460 |
| 2006/0166465 A1 * | 7/2006 | Ono | ................ | H01L 21/78 438/460 |
| 2006/0249816 A1 * | 11/2006 | Li | ................ | B23K 26/0604 257/618 |
| 2007/0272668 A1 * | 11/2007 | Albelo | ................ | B23K 26/386 219/121.72 |
| 2008/0029154 A1 * | 2/2008 | Milshtein | ................ | H01L 31/022425 136/256 |
| 2009/0098713 A1 * | 4/2009 | Sakamoto | ................ | B23K 26/16 438/463 |
| 2010/0044359 A1 * | 2/2010 | Sawabe | ................ | B23K 26/03 219/121.83 |
| 2010/0297830 A1 * | 11/2010 | Morikazu | ................ | B23K 26/0626 438/462 |
| 2010/0297831 A1 * | 11/2010 | Morikazu | ................ | H01L 21/67132 438/463 |
| 2010/0297855 A1 * | 11/2010 | Morikazu | ................ | B23K 26/032 438/795 |
| 2010/0317172 A1 * | 12/2010 | Morikazu | ................ | B23K 26/0608 438/463 |
| 2011/0129958 A1 * | 6/2011 | Rekow | ................ | B23K 26/03 438/95 |
| 2011/0287607 A1 * | 11/2011 | Osako | ................ | B23K 26/0608 438/462 |
| 2016/0074959 A1 * | 3/2016 | Maeda | ................ | H01L 21/681 425/142 |
| 2016/0332260 A1 * | 11/2016 | Odanaka | ................ | B23K 26/364 |

* cited by examiner

LASER PROCESSING APPARATUS

BACKGROUND OF THE INVENTION

Field of the Invention

The present invention relates to a laser processing apparatus.

Description of the Related Art

There has been known a processing method wherein a laser beam is applied by a laser processing apparatus to a semiconductor wafer having a plurality of devices such as integrated circuits (ICs) formed thereon (hereinafter referred to simply as "wafer"), to form modified layers along division lines (streets), and, with the modified layers as start points of breakage (splitting), the wafer is divided into individual device chips. The laser processing apparatus is capable of forming an intermittent modified layer by switching application of the laser beam and stopping of the application. Therefore, the laser processing apparatus is capable of processing a wafer having discontinuous division lines (see, for example, Japanese Patent Laid-open Nos. 2010-123723 and 2015-020177).

SUMMARY OF THE INVENTION

On the wafer, a plurality of devices are disposed in regions partitioned by a plurality of intersecting division lines. If a start point or end point of a modified layer extending in a direction along one division line is located beyond a modified layer extending in a direction along an intersecting division line (a division line intersecting with the one division line), there would arise a problem that at the time of breaking (splitting) the wafer into individual device chips, the modified layer (extending in one direction) extending beyond the modified layer extending in the intersecting direction develops a crack into a device region, leading to division of a device. In view of this, the position to which the laser beam is applied has to be set with high accuracy.

Conventionally, processing conditions are set in such a manner that the laser beam is applied to the vicinity of the center of a division line displayed on display means. However, even a positional error occurring on a micrometer order in the set processing conditions would bring about the above-mentioned problem; therefore, it is difficult to satisfactorily set the processing conditions.

Meanwhile, it has been found that when a start point or end point of a modified layer extending in one direction is set at a position a little separate from a modified layer extending in an intersecting direction, a leaking laser beam does not reach any device region, so that there is obtained an effect of reducing the possibility of breakage of the device. Thus, there has been a demand for setting the position of a start point or end point of a modified layer extending in one direction, with high accuracy in relation to a modified layer extending in an intersecting direction.

Accordingly, it is an object of the present invention to provide a laser processing apparatus capable of highly accurate setting of the positions of a start point and an end point of a modified layer.

In accordance with an aspect of the present invention, there is provided a laser processing apparatus for applying a laser beam to a wafer, the wafer having set thereon first division lines extending in a first direction and second division lines extending in a direction orthogonal to the first direction, the wafer provided with regions in which start points or end points of the first division lines formed intermittently are connected to the second division lines, to thereby form modified layers inside the wafer along the first division lines and the second division lines, the laser processing apparatus including: a chuck table that holds the wafer on a holding surface; laser beam applying means that applies a laser beam having such a wavelength as to be transmitted through the wafer, to the wafer held by the chuck table; movement means that brings the chuck table and the laser beam applying means into relative movement; display means that displays an image obtained by imaging the wafer held by the chuck table; storage means that stores processing conditions for processing the wafer; and processing line calculation section that displays a position at which the modified layer is planned to be formed and which is stored as the processing condition, on the display means as a processing line, wherein the processing line calculation section includes an output section that displays the processing line on the display means in a state of being superimposed on the first division line, in the region in which the start point or end point of the first division line is connected to the second division line, and a position of a start point or end point of a first modified layer formed along the first division line is permitted to be re-set in such a manner as not to interfere with a second modified layer formed along the second division line.

According to the laser processing apparatus of the present invention, the positions of the start points and end points of the modified layers can be set with high accuracy.

The above and other objects, features and advantages of the present invention and the manner of realizing them will become more apparent, and the invention itself will best be understood from a study of the following description and appended claim with reference to the attached drawings showing some preferred embodiments of the invention.

DETAILED DESCRIPTION OF THE PREFERRED EMBODIMENTS

An embodiment of the present invention will be described in detail below referring to the drawings. The present invention is not to be limited by the contents of the following description of the embodiment. In addition, the components described below include those which can be easily supposed by one skilled in the art and those which are substantially the same as the described ones. Further, the configurations described below can be appropriately combined with one another. Besides, various omissions, replacements and modifications of configurations are possible without departing from the spirit or scope of the present invention.

A laser processing apparatus 1 according to the present embodiment will be described referring to FIG. 1. The laser processing apparatus 1 applies a laser beam to a wafer W held by a chuck table 10, to thereby form modified layers along first division lines L1 and second division lines L2 in the inside of the wafer W.

Figure 2:
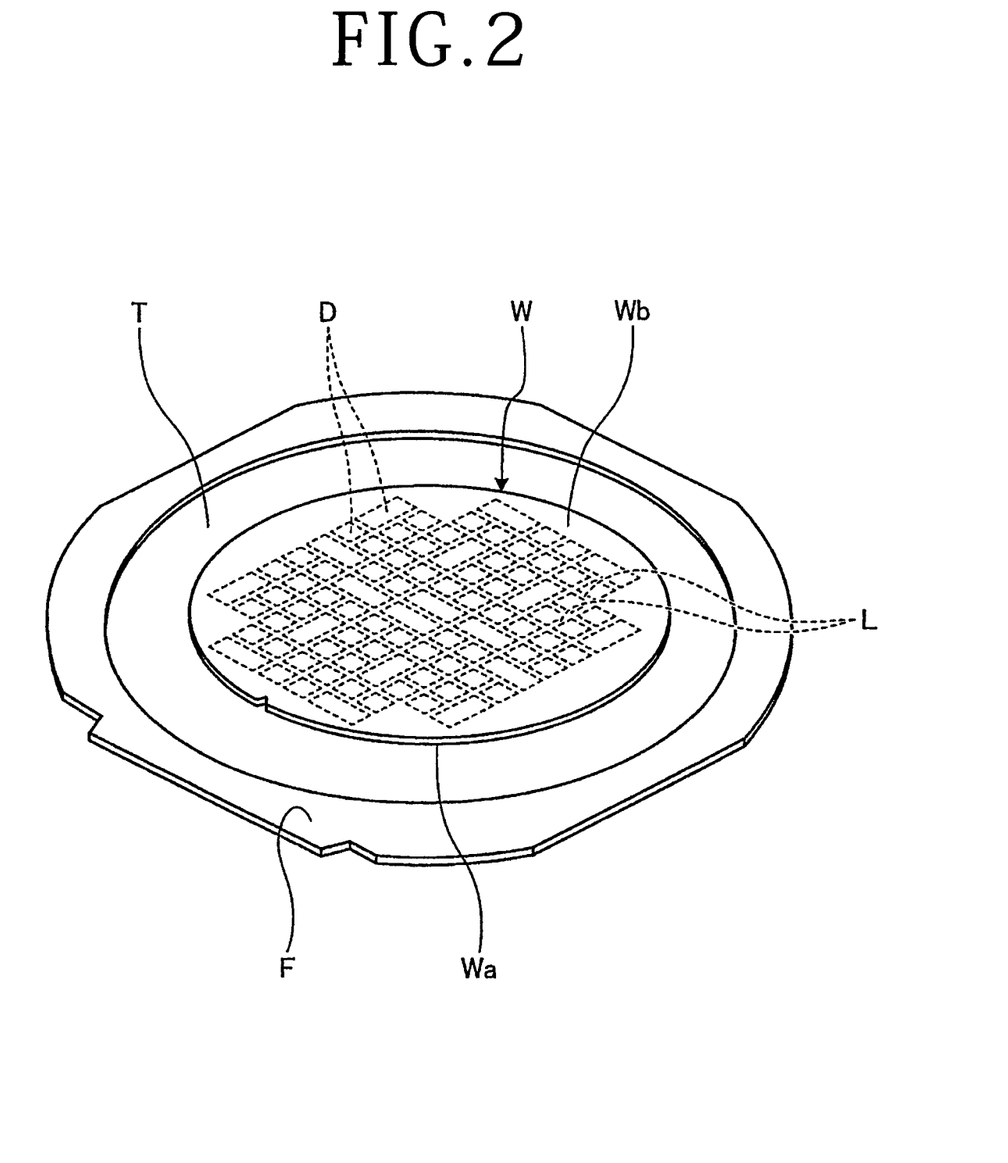
FIG. 2 is a perspective view of a wafer to be processed by the laser processing apparatus according to the embodiment.
Figure 3:
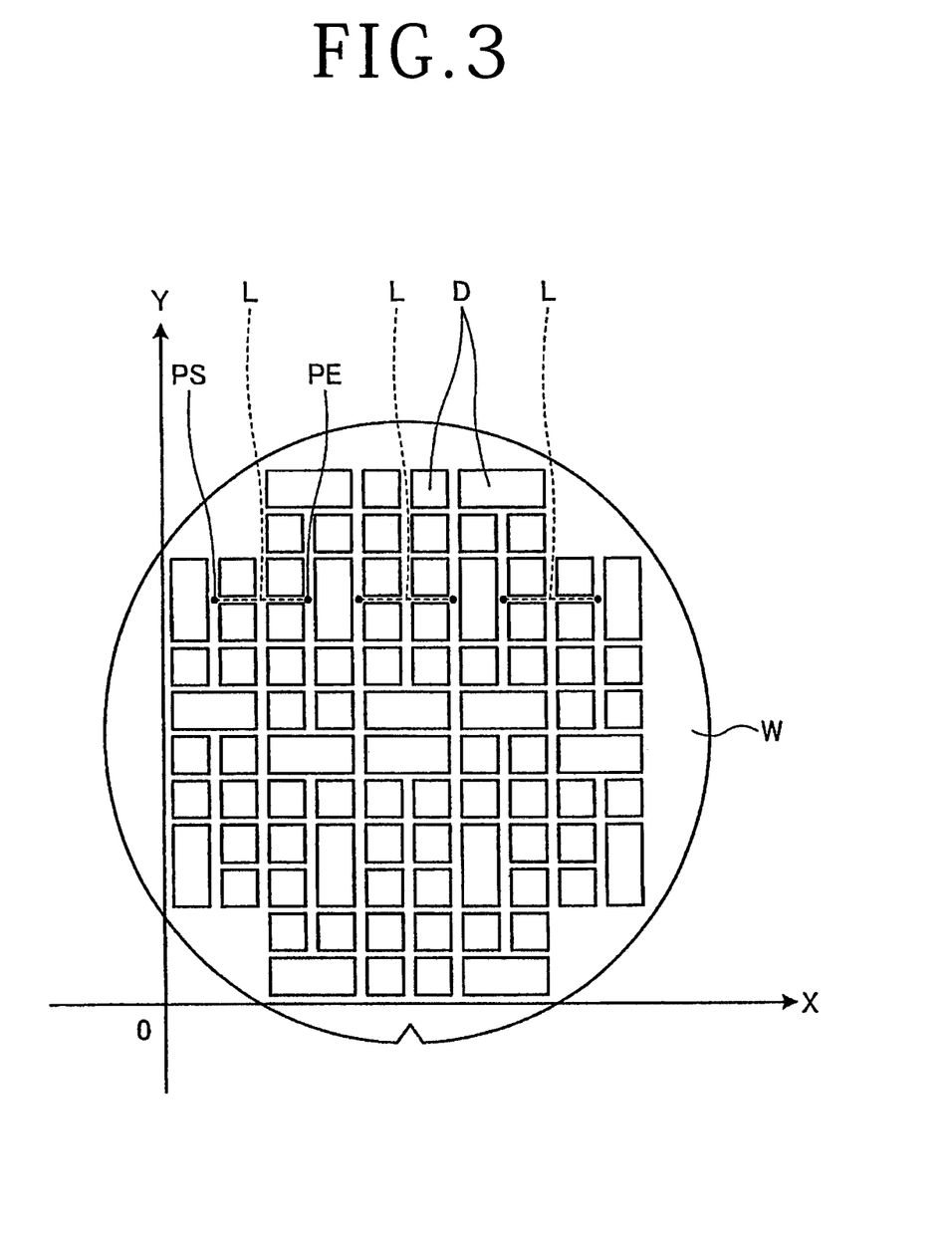
FIG. 3 is a plan view of the wafer to be processed by the laser processing apparatus according to the embodiment.

As illustrated in FIG. 2, the wafer W has its front surface Wa stuck onto a surface of a pressure sensitive adhesive tape T attached to an annular frame F. On the front surface Wa of the wafer W, a plurality of devices D are formed in regions partitioned by a plurality of division lines L. In this embodiment, the wafer W includes the devices D which differ in size and shape. More specifically, on the wafer W, first division lines L1 extending in an X-axis direction (first direction) and second division lines L2 extending in a Y-axis direction (second direction) orthogonal to the X-axis direction are set. The wafer W is provided with regions in which a start point PS or end point PE of the first division line L1 formed intermittently is connected to the second division line L2. The wafer W thus configured is processed by the laser processing apparatus 1 to form modified layers, whereby the wafer W is divided into the individual devices D. In this embodiment, the wafer W to be processed by the laser processing apparatus 1 is a circular disc-shaped semiconductor wafer or optical device wafer including silicon, sapphire, gallium or the like as a base material.

Returning to FIG. 1, the laser processing apparatus 1 includes a main body section 2 having a substantially rectangular parallelepiped shape, a wall section 3 rising upward on a rear side of the main body section 2, and a support column 4 projecting forward from the wall section 3. The laser processing apparatus 1 includes: a chuck table 10 adapted to hold the wafer W thereon; X-axis movement means 20 by which the chuck table 10 and laser beam applying means 50 are relatively moved in the X-axis direction; Y-axis movement means 30 by which the chuck table 10 and the laser beam applying means 50 are relatively moved in the Y-axis direction; rotation means 40 by which the chuck table 10 is rotated about a center axis parallel to a Z-axis direction; the laser beam applying means 50 that applies a pulsed laser beam to the wafer W held by the chuck table 10 to perform laser processing; imaging means 60; and control means 100.

The chuck table 10 has a holding surface 10*a* for holding the wafer W thereon. The holding surface 10*a* holds the wafer W stuck to an opening portion of the frame F through the pressure sensitive adhesive tape T. The holding surface 10*a* is circular disc-like in shape and formed from a porous ceramic or the like, and is connected to a vacuum source (not shown) through a vacuum drawing line (not shown). The holding surface 10*a* suction holds the wafer W placed thereon through the pressure sensitive adhesive tape T. In the periphery of the chuck table 10, a plurality of clamp sections 11 for clamping the frame F in the periphery of the wafer W are arranged.

The X-axis movement means 20 is processing feeding means that moves the chuck table 10 in the X-axis direction, to perform processing feeding of the chuck table 10 in the X-axis direction. The X-axis movement means 20 includes a ball screw 21 provided to be rotatable about an axis, a pulse motor 22 for rotating the ball screw 21 about the axis, and guide rails 23 for supporting the chuck table 10 in such a manner that the chuck table 10 can be moved in the X-axis direction.

The Y-axis movement means 30 is indexing feeding means that moves the chuck table 10 in the Y-axis direction, to perform indexing feeding of the chuck table 10. The Y-axis movement means 30 includes a ball screw 31 provided to be rotatable about an axis, a pulse motor 32 for rotating the ball screw 31 about the axis, and guide rails 33 for supporting the chuck table 10 in such a manner that the chuck table 10 can be moved in the Y-axis direction.

The rotation means 40 rotates the chuck table 10 about the center axis parallel to the Z-axis direction. The rotation means 40 is disposed on a movable table 12 which is moved in the X-axis direction by the X-axis movement means 20.

The laser beam applying means 50 performs laser processing on the wafer W held by the chuck table 10. More specifically, the laser beam applying means 50 applies a laser beam having such a wavelength as to be transmitted through the wafer W to the wafer W held by the chuck table 10, to form modified layers in the inside of the wafer W. The laser beam applying means 50 includes oscillation means for oscillating laser light, and focusing means for focusing the laser light on a desired position in the wafer W. The laser beam applying means 5 is mounted to a tip end of the support column 4.

The imaging means 60 images from above the wafer W held by the chuck table 10, and is disposed at such a position as to be aligned side by side with the laser beam applying means 50 in the X-axis direction. The imaging means 60 is mounted to the tip end of the support column 4. The imaging means 60 has an imaging element for detecting light which is in an infrared region such as to be difficultly absorbed in the wafer W. The imaging means 60 outputs an image obtained by imaging to the control means 100.

The control means 100 controls the above-mentioned components individually, to cause the laser processing apparatus 1 to perform a laser processing operation on the wafer W. The control means 100 includes a computer system. The control means 100 includes an arithmetic process device having a microprocessor such as a central processing unit (CPU), a storage device having a memory such as read only memory (ROM) or random access memory (RAM), and an input/output interface device.

The arithmetic process device of the control means 100 performs an arithmetic process according to a computer program stored in the storage device, and outputs control signals for controlling the laser processing apparatus 1, to the aforementioned components of the laser processing apparatus 1 through the input/output interface device. In addition, the control means 100 is connected to a display panel (display means) 110 having a liquid crystal display for displaying status of a processing operation, an image and the like, and input means to be used by an operator in registering information on processing and the like. The input means has at least one of a touch panel, a keyboard and the like provided on the display panel 110.

Figure 1:
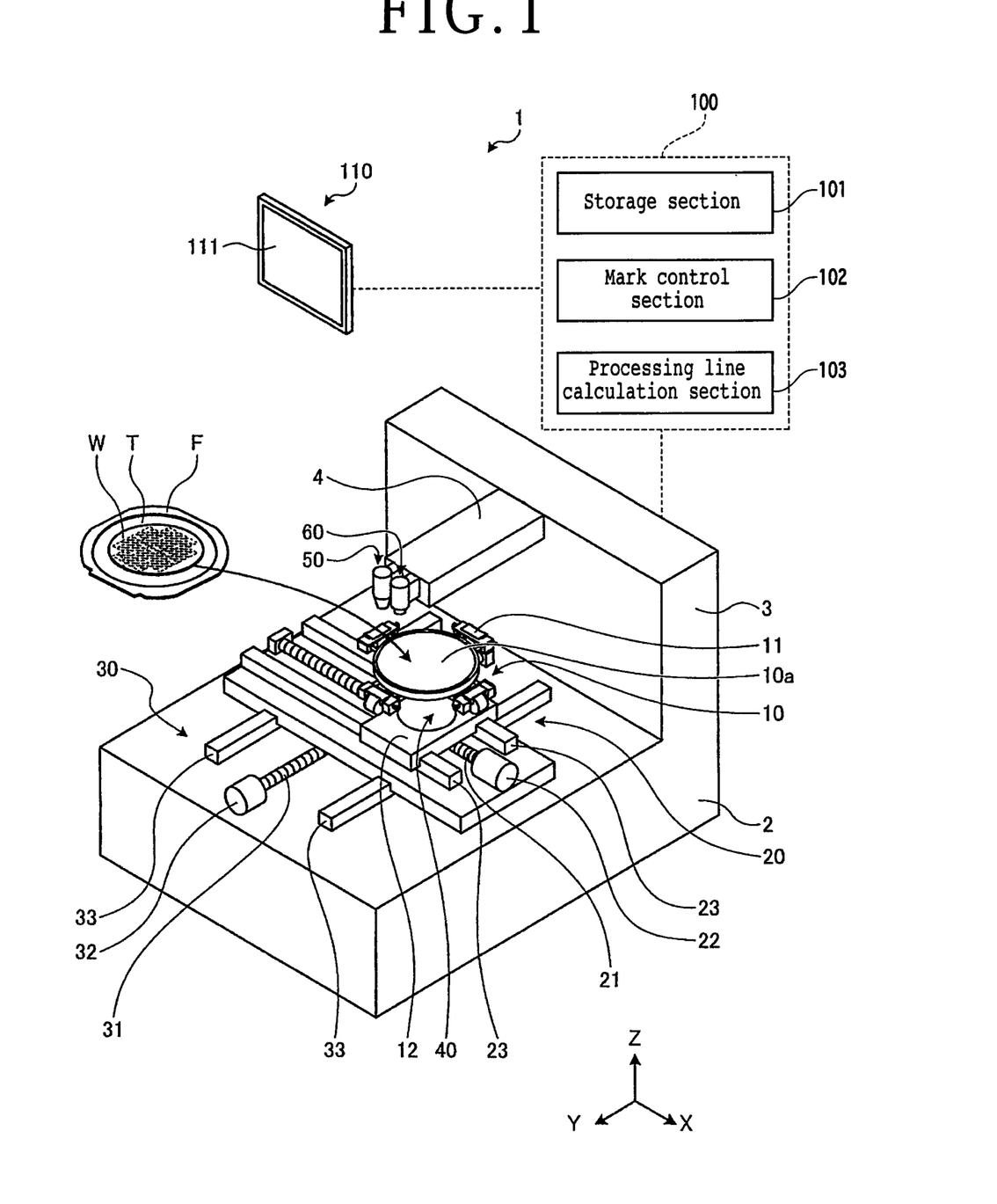
FIG. 1 is a perspective view of a laser processing apparatus according to an embodiment of the present invention.

As shown in FIG. 1, the control means 100 includes a storage section (storage means) 101, a mark control section 102, a processing line calculation section 103, and the display panel 110. Based on the image obtained by imaging by the imaging means 60, the control means 100 displays an image of a region 111A matched to a display screen 111 of the display panel 110.

The storage section 101 stores a program and data necessary for processing in the control means 100. The storage section 101 stores processing conditions for processing the wafer W. The processing conditions are information on a modified layer forming position LK, namely, a position where a modified layer is planned to be formed, or a position to which the laser beam is to be applied. In this embodiment, the modified layer forming position LK is set in terms of XY coordinates on the wafer W corresponding to a start point and an end point of a modified layer. In other words, the modified layer forming position LK is set as a processing line K that connects the start point and the end point of a modified layer.

Figure 4A:
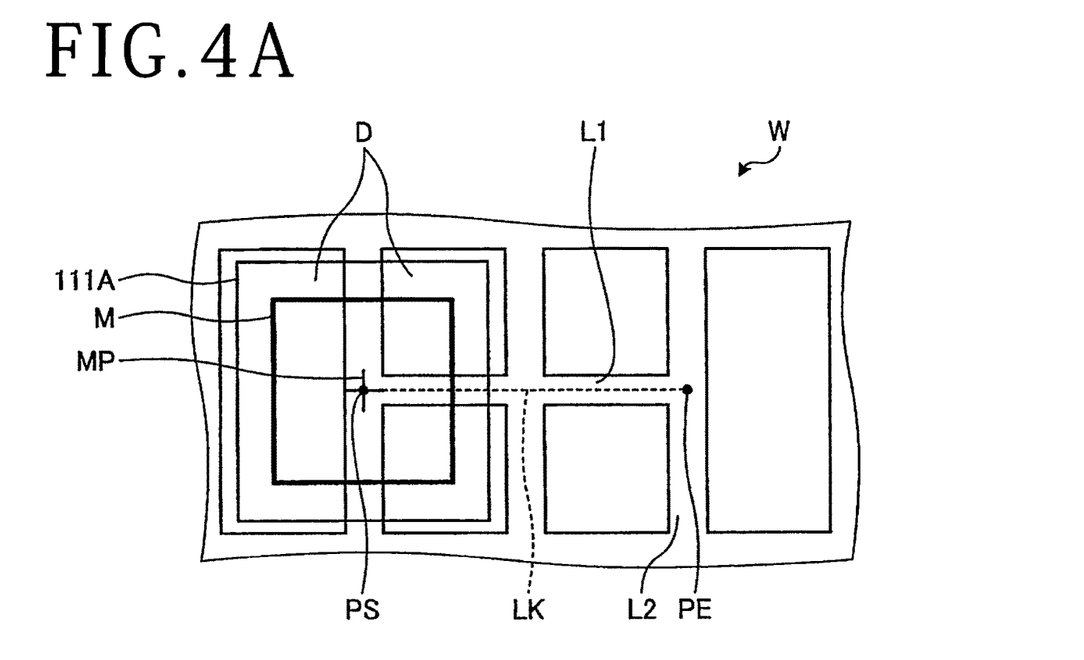
FIG. 4A schematically illustrates a procedure for setting a start point of a modified layer by the laser processing apparatus according to the embodiment.

The mark control section 102 causes the display panel 110 to display thereon a mark part M and a mark MP in the state of being superimposed on the image obtained by imaging, as illustrated in FIG. 4A. The mark part M is a square frame, which surrounds the periphery of the mark MP. The mark MP is a cross which is positioned in the center of the mark part M. In this embodiment, on the image displayed on the display panel 110, the mark MP is moved to a desired position, whereby the modified layer forming position LK can be set. The mark control section 102 converts the position of the mark MP on the image displayed on the display panel 110 into XY coordinates on the wafer W.

The processing line calculation section 103 displays the processing line K, which is an imaginary line, on the display panel 110 through an output section, based on the modified layer forming position LK stored in the storage section 101. More specifically, in the case where the second division line L2 having a modified layer forming position stored is already present at the time of displaying a region in which the start point PS or end point PE of a first division line L1 is connected to a second division line L2, the processing line calculation section 103 causes the processing line K to be displayed in the state of being superimposed along the position at which the modified layer is planned to be formed. In the case where the modified layer forming position LK stored in the storage section 101 as the processing condition is included in the region 111A of the XY coordinates on the wafer W corresponding to the image displayed on the display panel 110, the processing line calculation section 103 causes the modified layer forming position LK to be displayed as the processing line K on the display panel 110 in the state of being superimposed on the first division line L1 in the image obtained by imaging.

The display panel 110 is a touch type display panel. The display panel 110 displays the image of the wafer W held by the chuck table 10 obtained by imaging by the imaging means 60, based on the control signal from the control means 100. The display panel 110 displays the mark part M and the mark MP, together with the image obtained by imaging. The display panel 110 can set the positions of the start point and end point of each of the modified layers to be formed along the first division lines L1 and the second division lines L2. Further, in the case where the second division line L2 having the modified layer forming position stored is already present at the time of displaying the region where the start point PS or end point PE of the first division line L1 is connected to the second division line L2, the display panel 110 displays the processing line K in the state of being superimposed along the position at which the modified layer is planned to be formed. In this case, the display panel 110 can set the position of the start point or end point of the modified layer to be formed along the first division line L1 correspondingly to the position of the modified layer to be formed along the second division line L2.

An alignment method of the laser processing apparatus 1 for setting a start point and an end point of a modified layer by use of the laser processing apparatus 1 according to this embodiment will be described below. The alignment method of the laser processing apparatus 1 includes a wafer holding step, a first processing position setting step, and a second processing position setting step.

The wafer holding step is conducted. In the wafer holding step, the wafer W is held by the chuck table 10. More specifically, the front surface Wa of the wafer W attached to the opening part of the frame F through the pressure sensitive adhesive tape T is suction held onto the holding surface 10a, such that a back surface Wb of the wafer W is exposed while being oriented upward.

After the wafer holding step is performed, the first processing position setting step is carried out. In the first processing position setting step, a start point and an end point of a modified layer to be formed along a first division line L1 are registered.

More specifically, first, the control means 100 moves the chuck table 10 by the X-axis movement means 20 and the Y-axis movement means 30, so as to position the wafer W held by the chuck table 10 into a position under the imaging means 60. Then, the control means 100 causes the imaging means 60 to image the wafer W. The imaging means 60 outputs an image thus obtained to the control means 100. The control means 100 displays the image on the display panel 110.

Then, the operator rotates the chuck table 10 to adjust the orientation of the first division line L1 to be parallel to the X-axis direction (processing feed direction), and thereafter registers a key pattern (a specific figure pattern) formed in a device D (not shown). The key pattern of the wafer W newly held by the chuck table 10 is read, whereby the position of the wafer W can be indexed, and the position of the division line L (the position at which to form the modified layer) can be indexed. Thereafter, while registering the distance from the key pattern thus registered, the start point of a first division line L1 is set as a start point of a modified layer. For instance, the operator performs a tapping operation on the start point PS of the first division line L1 displayed on the display panel 110. As shown in FIG. 4A, the control means 100 causes the surroundings of the start point PS to be enlargedly displayed on the display screen 111 of the display panel 110 indicated by the square frame in the figure. In this instance, on the display panel 110, the mark part M and the mark MP are displayed in the state of being superimposed on the image obtained by imaging.

Note that for explanation, the modified layer forming position LK for the modified layer to be formed in a direction along the first division line L1 is indicated by a broken line. Then, while performing a touching operation on the display panel 110, the operator moves the mark MP until the mark MP coincides with the start point PS, as depicted in FIG. 4A. Subsequently, the operator performs, for example, an operation of touching an icon for setting a start point, in a condition where the mark MP coincides with the start point PS, thereby setting the start point PS as a start point of a modified layer. The control means 100, by the mark control section 102, converts the position of the mark MP on the image obtained by imaging into XY coordinates on the wafer W. Then, the control means 100 stores the position of the start point PS, which is the XY coordinates thus converted, in the storage section 101 as one of the processing conditions.

Figure 4B:
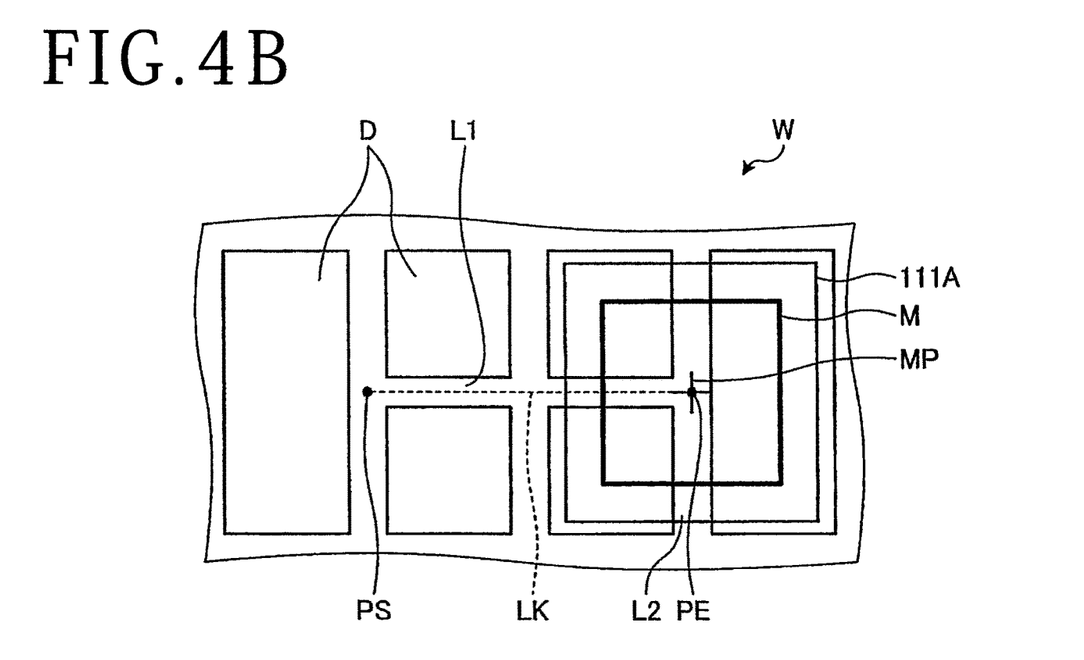
FIG. 4B schematically illustrates a procedure for setting an end point of the modified layer by the laser processing apparatus according to the embodiment.

Next, the operator sets the end point PE of the first division line L1 as an end point of the modified layer. For example, while performing a touching operation on the display panel 110, the operator moves the mark MP until the mark MP coincides with the end point PE, as depicted in FIG. 4B. Then, the operator performs, for example, an operation of touching an icon for setting an end point, in a condition where the mark MP coincides with the end point PE, thereby setting the end point PE as an end point of the modified layer. The control means 100, by the mark control section 102, converts the position of the mark MP on the image obtained by imaging into XY coordinates on the wafer W. Then, the control means 100 stores the position of the end point PE, which is the XY coordinates thus converted, in the storage section 101 as one of the processing conditions.

By repeating such a procedure along the first division line L1, the operator sets the start point and the end point of a modified layer to be intermittently formed along the first division line L1. In this way, the intermittent processing line K extending in the direction along the first division line L1 is set and stored as a processing condition. Furthermore, the same procedure is repeated also for other division lines extending in the direction parallel to the first division line L1.

After the first processing position setting step is conducted, the second processing position setting step is carried out. In the second processing position setting step, start points and end points of modified layers to be formed along the second division lines L2 extending in the direction orthogonal to the first division lines L1 are registered. In this embodiment, description is made based on a configuration wherein the modified layer to be formed in the direction along the first division line L1 and the modified layer to be formed in the direction along the second division line L2 are set to be a little separate from each other.

More specifically, first, the control means 100 rotates the chuck table 10 by 90 degrees by the rotation means 40. Then, the operator rotates the chuck table 10 to adjust the orientation of the second division line L2 to be parallel to the X-axis direction (processing feed direction), and thereafter registers a key pattern (specific figure pattern) formed in the device D (not shown). Thereafter, while registering the distance from the key pattern thus registered, the start point of the second division line L2 is set as a start point of a modified layer, by the same procedure as that for the start point of the first division line L1. Then, the operator sets the end point of the second division line L2 as an end point of the modified layer, by the same procedure as that for the end point of the first division line L1.

Figure 5:
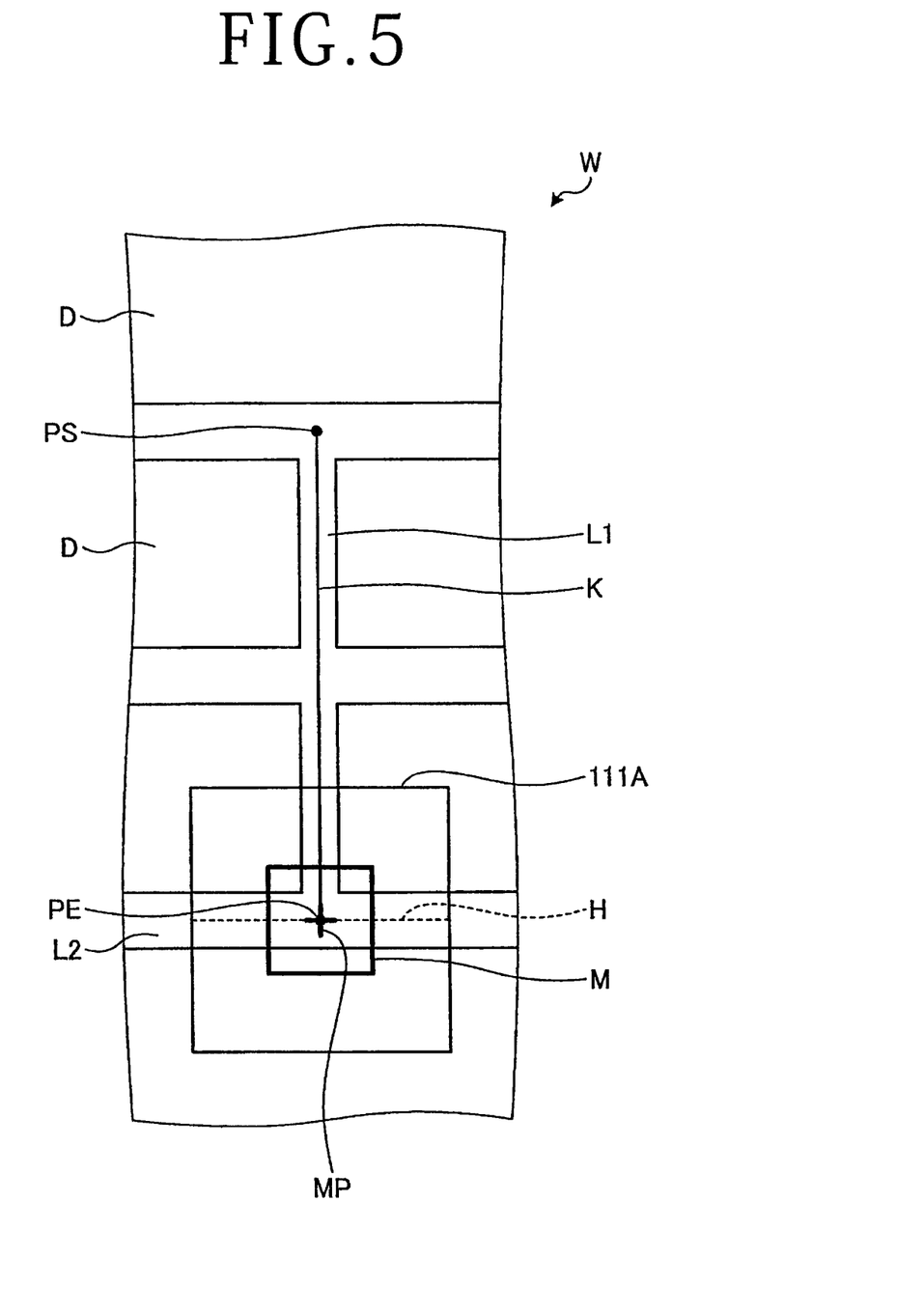
FIG. 5 schematically illustrates a procedure for setting a start point or end point of a second modified layer extending in a direction intersecting a first modified layer by the laser processing apparatus according to the embodiment.

In the second processing position setting step, as illustrated in FIG. 5, the control means 100, by the processing line calculation section 103, displays on the display panel 110 a processing line K having been set and intersecting the second division line L2. In this instance, a hair line H which is indicative of a reference line of a camera included in the imaging means 60 and is a target line at the time of designating an applying position of the laser beam applied on the second division line L2 by the laser beam applying means 50 is displayed on the display panel 110. In other words, the processing line K having been set in the first processing position setting step and the hair line H as the target line are displayed on the display panel 110.

For example, in the case where the processing line K is displayed on the display panel 110 in a direction intersecting the second division line L2 during when the mark MP is moved from the start point until the mark MP coincides with the end point, the operator corrects the start point or end point of the processing line K that has been set. For instance, the operator performs a tapping operation on the end point PE of the first division line L1 which is an intersection between the second division line L2 and the processing line K that are displayed on the display panel 110. Then, while performing a touching operation on the display panel 110, the operator moves the mark MP to above the end point PE of the first division line L1 in FIG. 5 such that the end point PE of the first division line L1 and the hair line H are a little (10 μm or less) separated from each other. Then, the operator performs, for example, an operation of touching an icon for setting an end point, in the condition where the mark MP is positioned above the end point PE of the first division line L1, to thereby set a corrected end point PE. The control means 100, by the mark control section 102, converts the position of the mark MP on the image obtained by imaging into XY coordinates on the wafer W. The control means 100 stores the position of the end point PE thus corrected, which is the XY coordinates thus converted, in the storage section 101.

By repeating such a process along the second division line L2, the operator sets a start point and an end point of a modified layer to be intermittently formed along the second division line L2. In this manner, an intermittent processing line K extending in a direction along the second division line L2 is set and stored as a processing condition. In addition, the operator corrects and sets the start point or end point of the modified layer, for all the processing lines K set in the direction orthogonal to the second division line L2. Furthermore, the same procedure is repeated also for other division lines extending in the direction parallel to the second division line L2.

As an alternative embodiment, such a setting that the modified layer to be formed in the direction along the first division line L1 and the modified layer to be formed in the direction along the second division line L2 will be a little separate from each other may be made in the second processing position setting step, in the manner as follows.

Specifically, in the case where the processing line K is displayed on the display panel 110 in the direction orthogonal to the second division line L2 at the time of setting the second division line L2, the operator registers a start point or end point of the second division line L2 such that the start point or end point will be a little (for example, 10 μm or less) separate from the processing line K having been set. For instance, the operator performs a tapping operation on the end point PE of the first division line L1, which is an intersection between the second division line L2 and the processing line K that are displayed on the display panel 110. Then, while performing a touching operation on the display panel 110, the operator moves the mark MP to below the end point PE of the first division line L1 in FIG. 5. Then, in the condition where the mark MP is positioned below the end point PE of the first division line L1, the operator moves the mark MP along the second division line L2 to the start point, and performs, for example, an operation of touching an icon for setting a start point, thereby setting a start point PS of a modified layer to be intermittently formed along the second division line L2. The control means 100, by the mark control section 102, converts the position of the mark MP on the image obtained by imaging into XY coordinates on the wafer W. The control means 100 stores the position of the start point PS, which is the XY coordinates thus converted, in the storage section 101.

Next, the operator moves the mark MP along the second division line L2 to the end point, and performs, for example, an operation of touching an icon for setting an end point, thereby setting the end point PE. The control means 100, by the mark control section 102, converts the position of the mark MP on the image obtained by imaging into XY coordinates on the wafer W. The control means 100 stores the position of the end point PE, which is the XY coordinates thus converted, in the storage section 101. By repeating such a process along the second division line L2, the operator sets a start point and an end point of a modified layer to be intermittently formed along the second division line L2 in such a manner that the start point and the end point will be a little separate from the modified layer to be formed in the direction along the first division line L1.

In this way, the operator sets the start points and the end points of the modified layers along all the division lines L on the wafer W, by the aforementioned alignment method. When the start points and the end points of all the modified layers in the wafer W have been set, a modified layer forming step is carried out.

As has been described above, according to this embodiment, in the case where at least either one of the first division line L1 and the second division line L2 having the modified layer forming position stored is already present at the time of displaying a region in which the start point PS or end point PE of the first division line L1 is connected to the second division line L2, as shown in FIG. 5, the processing line K is displayed in the state of being superimposed along the position at which the modified layer is planned to be formed. In other words, the processing line K which has been set in the first processing position setting step and the hair line H which is a target line are displayed on the display panel 110. Therefore, the positions of the start point and the end point of a modified layer to be formed along the intermittent division line L can be set easily and accurately, with the processing line K and the hair line H as a clue. Thus, according to this embodiment, the positions of the start points and the end points of the modified layers can be set with high accuracy.

Figure 6:
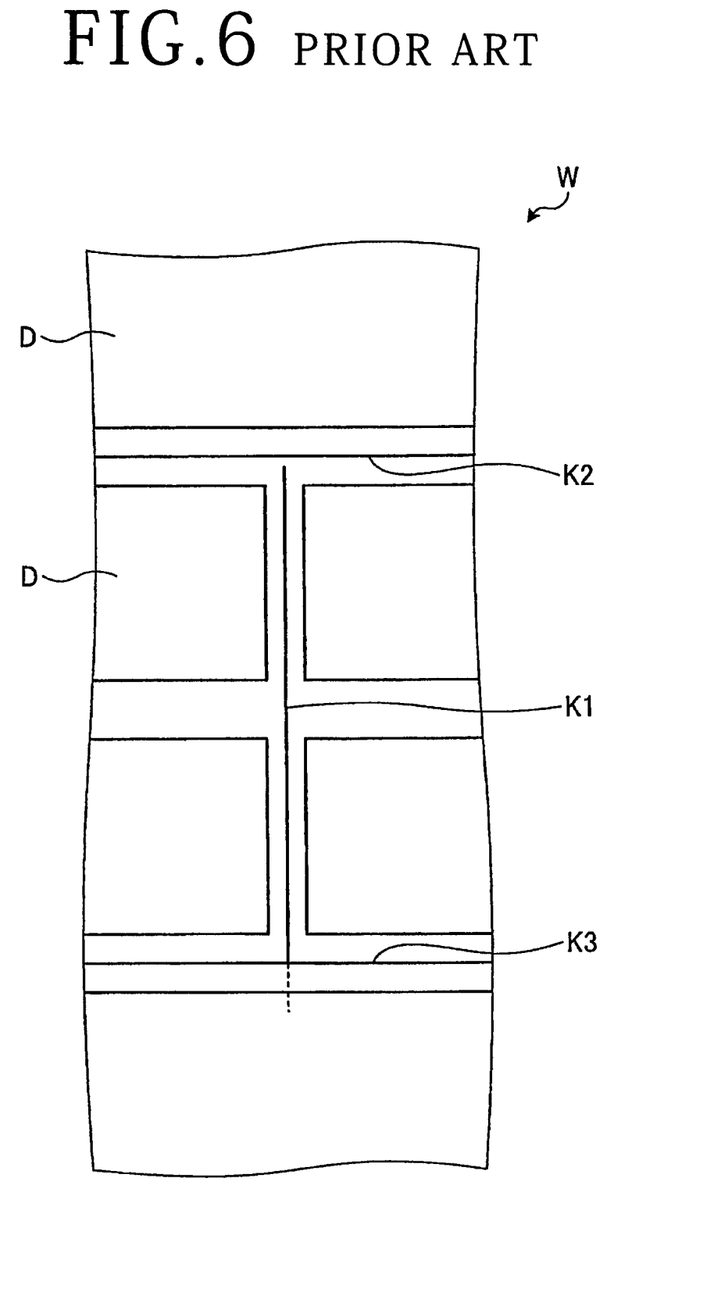
FIG. 6 schematically illustrates modified layers set by a conventional laser processing apparatus.

Here, for comparison, setting of a start point and an end point of a modified layer by use of a conventional laser processing apparatus will be described referring to FIG. 6. FIG. 6 schematically illustrates a modified layer set by a conventional laser processing apparatus. In the conventional laser processing apparatus, even in regard of a division line having a modified layer forming position stored, the processing line having been set is not displayed on the display panel. Therefore, it is necessary for the operator to set a start point and an end point of the modified layer to be formed along each division line, with the hair line as a clue, and, accordingly, it is difficult to set the start point and the end point with high accuracy. In addition, the start points and the end points of the modified layers to be formed along the division lines have to be individually set on a division line basis. Therefore, it is difficult, for example, to set the start point and the end point of a modified layer at positions a little separate from another modified layer extending in an intersecting direction.

When the setting is conducted by use of such a conventional laser processing apparatus, the processing lines to be formed to extend in intersecting directions may be set in the state of being largely separate from each other, like a processing line K1 and a processing line K2. In such a case, unsatisfactory breaking (unsatisfactory splitting) is liable to occur, and division along the division line may be impossible to achieve. Besides, a processing line extending in an intersecting direction may be set in the state of extending beyond a processing line on one side, like the processing line K1 and a processing line K3. In such a case, at the time of breaking (splitting) the wafer W into individual devices, a crack may be developed into a device region, resulting in division of a device D.

On the other hand, according to this embodiment, a modified layer to be formed in the direction along the first division line L1 and a modified layer to be formed in the direction along the second division line L2 can be set with high accuracy. In this embodiment, it is possible to inhibit the occurrence of, for example, a situation wherein a start point or end point of a modified layer to be formed to extend in the direction along one division line is set at a position located beyond a modified layer to be formed to extend along the direction of an intersecting division line. As a result, in this embodiment, at the time of breaking (splitting) the wafer into individual device chips, it is possible to inhibit the occurrence of a situation in which a crack is developed into a device region, resulting in division of a device.

Alternatively, in this embodiment, it is possible, for example, to easily perform such an accurate positioning that a modified layer to be formed in the direction along the first division line L1 and a modified layer to be formed in the direction along the second division line L2 are connected to each other at a point. Thus, in this embodiment, by performing such a setting that the modified layer to be formed in the direction along the first division line L1 and the modified layer to be formed in the direction along the second division line L2 are connected to each other at a point, it is possible to form the modified layers at appropriate positions and thereby to reliably divide the wafer W into individual devices D, even in the case where the wafer W is thick, for example.

Alternatively, in this embodiment, it is possible, for example, to easily perform such a setting that a modified layer to be formed in the direction along the first division line L1 and a modified layer to be formed in the direction along the second division line L2 are a little separate from each other. Thus, in this embodiment, by performing such a setting that the modified layers will be a little separate from each other, it is possible to ensure that even if leakage of a laser beam is generated, the influence of the leakage on adjacent device regions can be suppressed.

In this manner, in this embodiment, a modified layer to be formed in the direction along the first division line L1 and a modified layer to be formed in the direction along the second division line L2 can be highly accurately set at desired positions, according to the characteristics of the wafer W to be processed, etc.

Note that the present invention is not to be limited to the above described embodiments. Various modifications are possible without departing from the spirit or scope of the present invention.

The present invention is not limited to the details of the above described preferred embodiments. The scope of the invention is defined by the appended claim and all changes and modifications as fall within the equivalence of the scope of the claim are therefore to be embraced by the invention.

What is claimed is:

1. A laser processing apparatus for applying a laser beam to a wafer, the wafer having set thereon first division lines extending in a first direction and second division lines extending in a direction orthogonal to the first direction, the laser processing apparatus comprising:
   a chuck table that holds the wafer on a holding surface;
   a laser beam applying unit including a laser oscillator that generates and applies a laser beam to the wafer held by the chuck table, wherein the laser beam has a wavelength that enables the laser beam to be transmitted through the wafer;
   movement means that brings the chuck table and the laser beam applying unit into relative movement;
   display means that displays an image obtained by imaging the wafer held by the chuck table;

storage means that stores processing conditions for processing the wafer; and control means configured to display a processing line on an image of the wafer on the display means at a position at which a modified layer is planned to be formed on the wafer and which is stored as one of the processing conditions, wherein the control means includes an output section that displays the processing line on the image of the wafer on the display means superimposed on one of the first division lines in a region in which a start point or an end point of the first division line is connected to one of the second division lines, and a position of a first start point or a first end point of a first modified layer formed along one of the first division lines is permitted to be re-set in such a manner as not to interfere with a second modified layer formed along one of the second division lines.

2. The laser processing apparatus according to claim 1, wherein the control means includes a mark control section that controls a location of a mark part, which is a square frame including the first start point or the first end point of the first modified layer, and a mark, which is a cross positioned in the center of the mark part, the mark control section being configured to cause the display means to display the mark part and the mark superimposed on the image of the wafer.

3. The laser processing apparatus according to claim 1, wherein the control means includes a processing line calculation section that causes the display means to display the processing line as an imaginary line on the image of the wafer.

4. The laser processing apparatus according to claim 1, wherein the display means includes a touch type display panel.

* * * * *